United States Patent
Ishimaru et al.

(10) Patent No.: US 9,506,154 B2
(45) Date of Patent: Nov. 29, 2016

(54) PLASMA PROCESSING METHOD

(71) Applicant: Hitachi High-Technologies Corporation, Minato-ku, Tokyo (JP)

(72) Inventors: Masato Ishimaru, Tokyo (JP); Takeshi Shimada, Tokyo (JP); Makoto Suyama, Tokyo (JP); Takahiro Abe, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/770,082

(22) PCT Filed: Nov. 19, 2014

(86) PCT No.: PCT/JP2014/080568
§ 371 (c)(1),
(2) Date: Aug. 24, 2015

(87) PCT Pub. No.: WO2016/079818
PCT Pub. Date: May 26, 2016

(65) Prior Publication Data
US 2016/0138170 A1    May 19, 2016

(51) Int. Cl.
*B44C 1/22* (2006.01)
*C23F 1/02* (2006.01)
*C23F 1/12* (2006.01)

(52) U.S. Cl.
CPC .. *C23F 1/02* (2013.01); *C23F 1/12* (2013.01)

(58) Field of Classification Search
CPC ..................................... C23F 1/02; C23F 1/12
USPC ..................................................... 216/22, 41
See application file for complete search history.

(56) References Cited

U.S. PATENT DOCUMENTS

| | | | |
|---|---|---|---|
| 8,747,680 B1 * | 6/2014 | Deshpande | H01L 43/12 216/22 |
| 2007/0202445 A1 | 8/2007 | Morioka | |
| 2008/0070130 A1 | 3/2008 | Anderson et al. | |

FOREIGN PATENT DOCUMENTS

| | | |
|---|---|---|
| JP | 9-237777 | 9/1997 |
| JP | 11-271958 A | 10/1999 |
| JP | 2002-299320 A | 10/2002 |
| JP | 2006-080355 (A) | 3/2006 |

(Continued)

OTHER PUBLICATIONS

International Search Report from International Patent Application No. PCT/JP2014/080568, Mar. 3, 2015.

(Continued)

*Primary Examiner* — Roberts Culbert
(74) *Attorney, Agent, or Firm* — Miles & Stockbridge P.C.

(57) ABSTRACT

A plasma processing method is provided for reducing dimensions of a film to be etched from patterned dimensions, and is capable of reducing dimensions without causing deformation or collapse of the film to be etched. A plasma processing method for trimming a tantalum film by plasma etching using a resist, an antireflective film disposed under the resist, and a mask film disposed under the antireflective film, includes the steps of trimming the antireflective film and the mask film by plasma etching with the resist as a mask; removing the resist and the antireflective film subjected to the trimming, by plasma; and trimming the tantalum film by plasma etching with a mask film obtained after the resist and the antireflective film subjected to the trimming are removed by plasma, as a mask.

5 Claims, 7 Drawing Sheets

(56) References Cited

FOREIGN PATENT DOCUMENTS

| | | |
|---|---|---|
| JP | 2007-081383 (A) | 3/2007 |
| JP | 2012-099589 A | 5/2012 |
| JP | 2013-077665 A | 4/2013 |
| JP | 2013-225624 A | 10/2013 |
| KR | 2010-0002067 A | 1/2010 |
| TW | 200821747 (A) | 5/2008 |

OTHER PUBLICATIONS

Taiwanese Office Action for corresponding Taiwanese Application No. 104126391 dated Jul. 6, 2016.
Japanese Office Action for corresponding Japanese Application No. 2015-533784 dated Jul. 11, 2016.
Office Action dated Aug. 19, 2016 for related Korean Application No. 10-2015-7020877.

* cited by examiner

PLASMA PROCESSING METHOD

TECHNICAL FIELD

The present invention relates to a plasma processing method and, in particular, to a plasma processing method for conducting trimming by plasma etching.

BACKGROUND ART

In recent years, a shift from the GMR (Giant Magnetic Resistance) technology to the TMR (Tunnel Magnetic Resistance) technology has been made to cope with capacity increase of hard disc drives, and density increase in the surface recording density has been promoted rapidly.

Along with this, fine processing is needed to manufacture a magnetic head used in the hard disc drive, and a fine plasma etching technology of the magnetic head is demanded. In manufacturing apparatuses of magnetic heads, therefore, adaptation to a plasma etching apparatus from ion milling apparatuses is being promoted.

The manufacturing method of the magnetic heads is nearly the same as the manufacturing method of the semiconductor devices; while a photoresist patterned by lithography is used as a mask, fine processing using plasma etching is conducted on non-volatile materials, such as $Al_2O_3$, NiFe, and Ru, together with materials frequently applied to semiconductor devices, such as $SiO_2$, Ta and Cr, formed on a substrate.

Incidentally, in fine processing using plasma etching in recent years, a photoresist patterned by lithography is reduced by plasma etching before a material to be etched is etched so that dimensions of wirings of the material to be etched are reduced by conducting plasma etching on the material to be etched with a mask pattern of the reduced photoresist.

For example, as a method (trimming) for reducing dimensions, a method is disclosed in Patent Literature 1, with which a photoresist patterned by lithography is reduced by isotropic or partially isotropic etching to form a patterned photoresist of reduced dimensions having a buried antireflective coating that also functions as an etch stop or a dummy layer so that the pattern of reduced dimensions provides an etch mask for subsequent anisotropic etching of underlying material such as polysilicon, metal, an insulator, or a ferroelectric substance.

In addition, as a method for reducing processing dimensions of a material to be etched from patterned dimensions, disclosed in Patent Literature 2 is a plasma etching method of etching a silicon carbide film using plasma with a laminated film as a mask, the laminated film including a previously patterned photoresist and a film selected from a Cr film, a Mn film, a Fe film, a Co film, a Ni film, a Y film, a Zr film, a Nb film, a Mo film, a Ru film, a Hf film, an Ir film, a Pt film, and an Au film or a film of an oxide containing an element selected from Cr, Mn, Fe, Co, Ni, Y, Zr, Nb, Mo, Ru, Hf, Ir, Pt, and Au, the method including the steps of: forming a mask for etching the film using a mixed gas of a chlorine gas and an oxygen gas and using the photoresist as a mask; and reducing dimensions of the film obtained in the above mask forming step using a mixed gas of a chlorine gas, an oxygen gas, and a rare gas after the above mask forming step.

As a dry etching method capable of conducting fast etching on a magnetic film having a thickness in the range of 200 to 500 nm and conducting favorable fine processing, for example, disclosed in Patent Literature 3 is a plasma processing method of dry etching a magnetic film having a thickness in the range of 200 to 500 nm, wherein a sample is subjected to dry etching on which a laminated film including a resist film, a non-organic film underlying the resist film, a Cr film underlying the non-organic film, and an $Al_2O_3$ film underlying the Cr film is formed on the magnetic film.

In addition, as an etching method of a Ta film, disclosed in Patent Literature 4, for example, is a method of etching a Ta film, which is a film to be etched and a non-volatile material, with high precision using a photoresist film as a mask pattern and using a mixed gas of $Cl_2$ and $O_2$.

CITATION LIST

Patent Literature

Patent Literature 1: JP-A-H09-237777
Patent Literature 2: JP-A-2013-225624
Patent Literature 3: JP-A-2012-99589
Patent Literature 4: JP-A-2002-299320

SUMMARY OF INVENTION

Technical Problem

At the time of etching of the antireflective film, the photoresist pattern is also etched and the pattern is reduced. As a result, a pattern having finer dimensions than the photoresist pattern immediately after development can be formed. In Patent Literature 1, however, it is necessary to secure an amount of the photoresist mask required to process an inorganic film layer and a problem is posed that limitation occurs in reduction of processing dimensions.

In the methods disclosed in Patent Literature 2 to 4, stress is applied on the photoresist pattern by a protective film of a reaction product that attaches to a side wall of the photoresist pattern, or photoresist resin is damaged by a halogen gas via a chemical action. In a case where the wiring is large, damages due to the stress or the chemical action the photoresist pattern receives may not become evident but, when the photoresist pattern after the reduction becomes 35 nm or less, a problem such as deformation or collapse of the photoresist pattern may occur in some cases.

Therefore, the present invention provides a plasma processing method for reducing dimensions of a film to be etched from patterned dimensions, which is capable of reducing dimensions without causing deformation or collapse of the film to be etched which may accompany the reduction of the dimensions to happen.

Solution to Problem

The present invention provides a plasma processing method for trimming a tantalum film by plasma etching using a resist, an antireflective film disposed under the resist, and a mask film disposed under the antireflective film, the plasma processing method including the steps of: trimming the antireflective film and the mask film by plasma etching with the resist as a mask; removing the resist subjected to the trimming and the antireflective film subjected to the trimming, by plasma; and trimming the tantalum film by plasma etching with a mask film obtained after the resist subjected to the trimming and the antireflective film subjected to the trimming are removed by plasma, as a mask.

Also, the present invention provides a plasma processing method for trimming a tantalum film by plasma etching using a resist, an antireflective film disposed under the resist, and a chromium film disposed under the antireflective film, the plasma processing method including the steps of: trimming the antireflective film and the chromium film by plasma etching with the resist as a mask using a mixed gas of chlorine gas and oxygen gas; removing the resist subjected to the trimming and the antireflective film subjected to the trimming, by plasma; and trimming the tantalum film by plasma etching with a chromium film obtained after the resist subjected to the trimming and the antireflective film subjected to the trimming are removed by plasma, as a mask using a mixed gas of chlorine gas, methane tetrafluoride gas, and helium gas.

Advantageous Effects of Invention

In the plasma processing method for reducing the dimensions of the film to be etched from the patterned dimensions, the present invention makes it possible to reduce dimensions without causing deformation or collapse of the film to be etched due to reduction of dimensions to happen.

DESCRIPTION OF EMBODIMENTS

Hereafter, an embodiment of a plasma etching method according to the present invention will be described with reference to the drawings. As a plasma etching processing apparatus applied for the present invention, a plasma processing apparatus that conducts plasma etching on a film to be etched arranged on a substrate, which is a sample, and that is supplied with plasma forming gas to generate gas plasma so that a metal film or the like formed on the substrate is etched.

Figure 1:
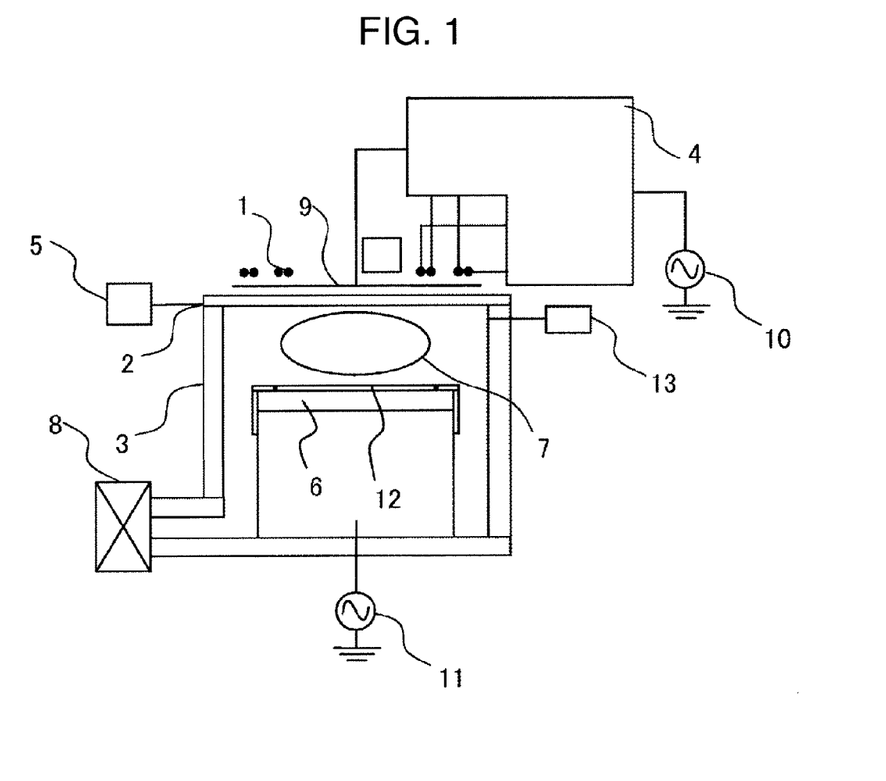
FIG. 1 is a section view of a configuration of a plasma etching apparatus according to the present invention.

FIG. 1 is a sectional view showing schematically an internal structure of a plasma etching apparatus according to the present invention. An upper portion of an etching processing chamber, that is a plasma etching processing chamber, is hermetically sealed by a dielectric window made of a dielectric material of quartz (SiO) or ceramics ($Al_2O_3$). Within an etching processing chamber 3, an electrode 6, on which a sample 12, that is a substance to be processed, is placed and to which radio frequency bias is applied, is disposed via an insulator. In addition, the etching processing chamber is grounded.

Over the dielectric window 2, an inductively coupled antenna 1 of a coil shape, which radiates an induction magnetic field to generate plasma, and a first radio frequency power supply 10, which supplies the inductively coupled antenna 1 with radio frequency power via a matching box 4, are disposed. The inside of the etching processing chamber 3 is supplied with process gas from a gas supply device 5, and evacuated and depressurized to a prescribed pressure by an evacuation device 8. The process gas is supplied to the inside of the etching processing chamber 3 from the gas supply device 5 and the process gas is converted to plasma by an induction magnetic field radiated by the inductively coupled antenna 1.

In addition, the electrode 6 is supplied with radio frequency bias power by a second radio frequency power supply 11 to draw ions existing in plasma 7 onto the sample 12. The present plasma etching apparatus has a configuration corresponding to etching of a nonvolatile etched material; control of deposition of a reaction product onto the dielectric window and its removal become possible by applying a radio frequency voltage to a Faraday shield 9, which is a capacitively coupled antenna disposed between the inductively coupled antenna 1 and the dielectric window 2. In addition, a light emission monitoring device 13 detects a change of light emission intensity of etching gas or light emission intensity of the reaction product and judges end of etching.

Figure 2:
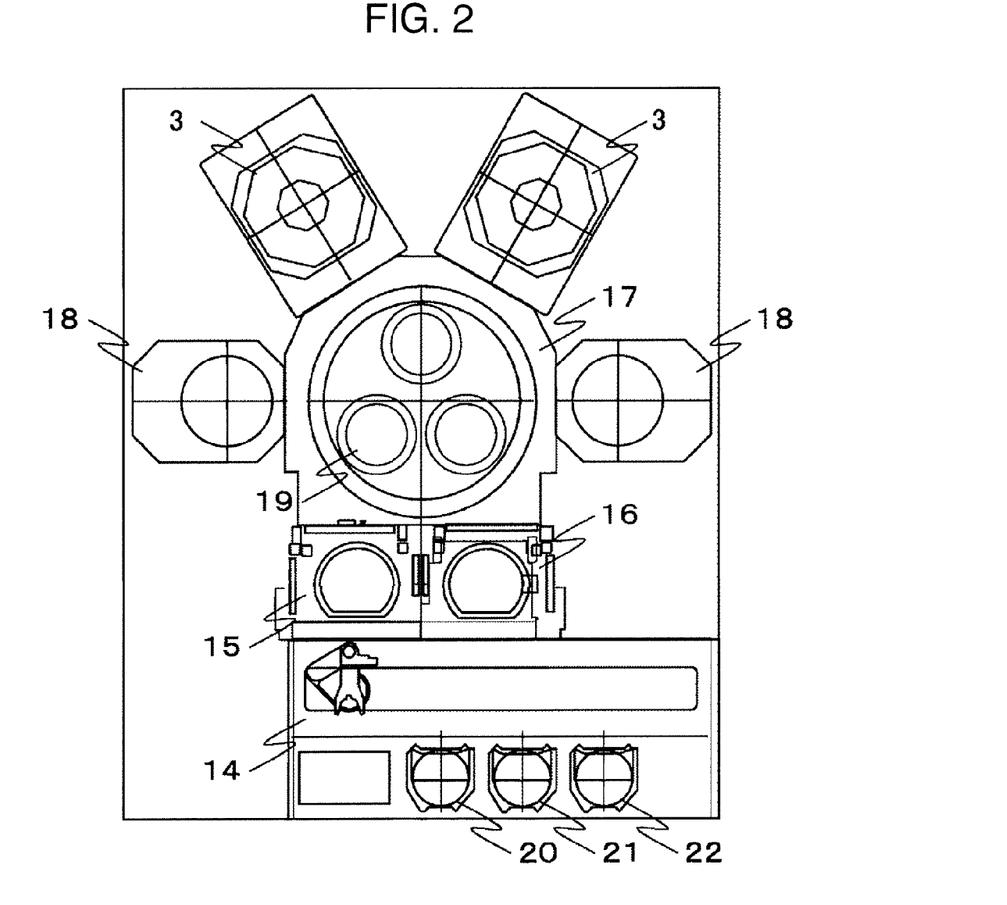
FIG. 2 is a configuration diagram of a plasma etching apparatus according to the present invention.

FIG. 2 shows an overall configuration of a plasma etching apparatus according to the present invention. An atmospheric loader 14 is coupled to a load lock chamber 15 and an unload lock chamber 16, and the load lock chamber 15 and the unload lock chamber 16 are configured to be coupled to a vacuum transfer chamber 17. In addition, the vacuum transfer chamber 17 is connected to the etching processing chambers 3 and ashing processing chambers 18.

The sample 12 is transferred by the atmospheric loader 14 and a vacuum transfer robot 19, subjected to etching in the etching processing chamber 3, and subjected to ashing in the ashing processing chamber 18. The system is configured in such a way that on the atmospheric loader 14, a first cassette 20, a second cassette 21, and a third cassette 22 are disposed, on which the sample 12 is placed respectively, and the sample 12 is transferred to the etching processing chamber 3 as required; after etching processing or ashing processing, the sample 12 returns to the original first cassette 20, second cassette 21, or third cassette 22. Hereafter, an embodiment of a plasma etching method according to the present invention will be described.

Figure 3:
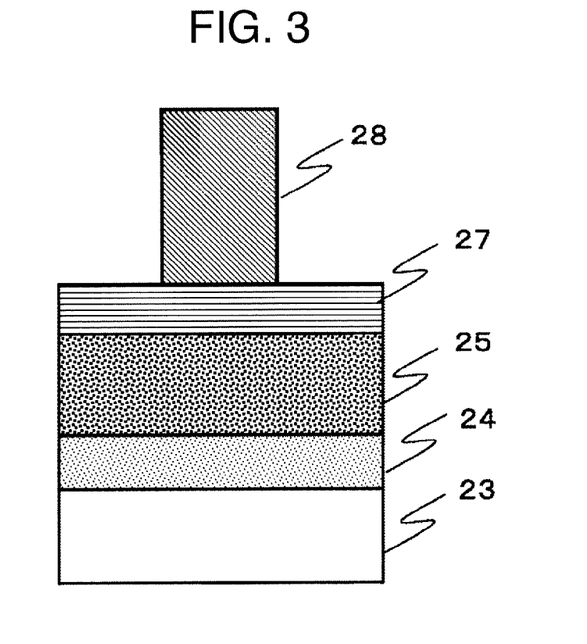
FIG. 3 is a schematic diagram showing a structure of a sample used in a present embodiment.

First, an example structure of a sample used in an embodiment of the present invention will be described. As shown in FIG. 3, an MTJ film 24 (30 nm), a Ta film 25 (50 nm), and an antireflective film 27 (60 nm) are disposed in this order from below over an AlTiC substrate 23 and a mask pattern is formed with a photoresist film 28 by lithography technique or the like. The MTJ film 24 is a laminated film for forming a magnetic tunnel junction element. These structures show one embodiment; kinds, thicknesses, orders, and so forth of laminated films are changed suitably according to the use. Incidentally, the dimension of the mask is set to 60 nm.

First, etching and reduction of dimensions are conducted on the photoresist film 28 and the antireflective film 27 to attain desired dimensions. Then, etching of the Ta film 25 is conducted. The Ta film 25 is low in volatility; therefore, a reaction product generated during etching of the Ta film 25 deposits on a side wall of the pattern and causes deformation or collapse of the pattern. When the photoresist film 28 and the antireflective film 27 are thicker, the reaction product sticking to the pattern increases and deformation or collapse more tends to happen.

On the other hand, when the photoresist film 28 and the antireflective film 27 are made thinner, the reaction product sticking to the pattern reduces and the deformation or collapse of the pattern becomes hard to occur. In the thin photoresist film 28 and antireflective film 27, however, it is not easy to obtain selectivity to the Ta film 25.

Figure 4:
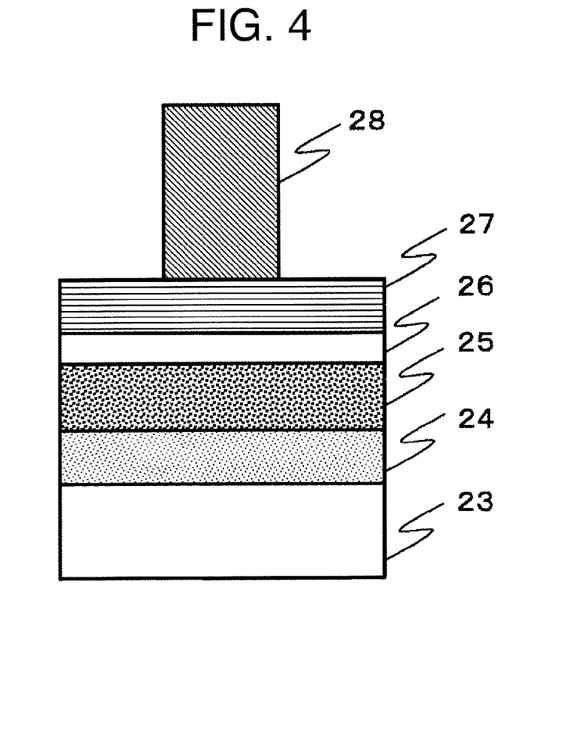
FIG. 4 is a schematic diagram showing a structure of a sample used in the present invention.

In the present invention, therefore, a Cr film 26, which becomes a second mask material, is formed on the Ta film 25 as illustrated in FIG. 4, and removal of the photoresist film 28 and the antireflective film 27 is executed after etching of the antireflective film 27 and the Cr film 26. Then, with the thin Cr film 26, the Ta film 25 is etched while making the Cr film 26 retreat using a gas with which selectivity to the Ta film 25 is obtained. It was found that desired dimensions were obtained without causing deformation or collapse of the pattern to happen by using this etching method. A plasma etching method of the present invention according to the present embodiment will now be described.

Figure 5:
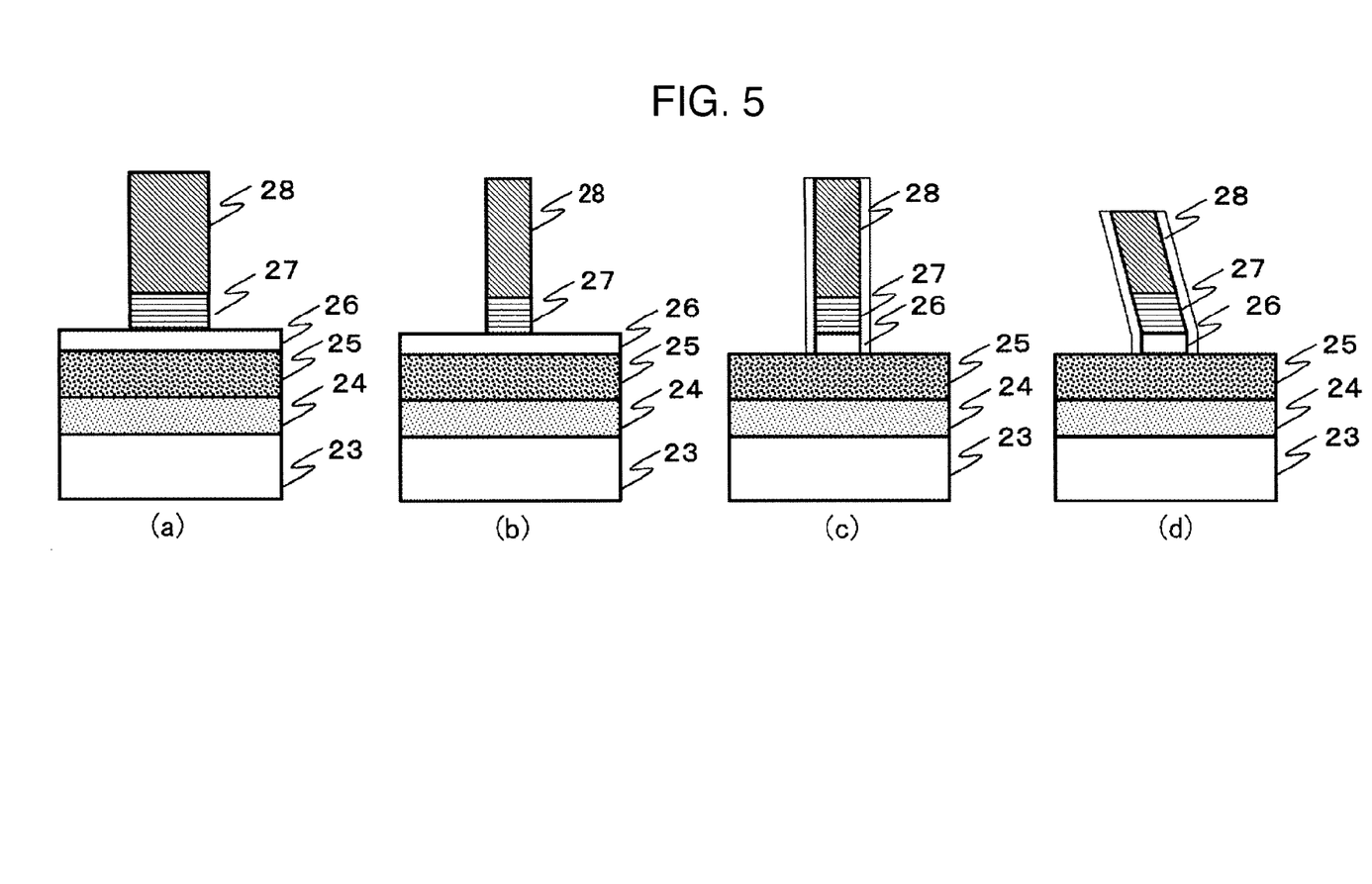
FIG. 5 is a diagram showing a flow of plasma etching.

It is a process for forming a first mask of a sample having the above-described structure as in FIG. 4. Usually, the antireflective film 27 and the Cr film 26 are etched using conditions suitable for respective films. First, as shown in FIG. 5(*a*), with the photoresist film 28 as a mask, the antireflective film 27 is etched while keeping the same dimensions as those of the mask. Then, as shown in FIG. 5(*b*), reduction is conducted to attain desired dimensions. This reduction to the desired dimensions is referred to as trimming.

Next, as shown in FIG. 5(*c*), etching of the Cr film 26 is conducted with the photoresist film 28 and the antireflective film 27, the dimensions of which are reduced, as a mask. At this time, a reaction product generated during the etching sticks to side walls of the photoresist film 28 and the antireflective film 27. When the reduction in dimensions is advanced, it becomes impossible to endure the weight of the sticking reaction product and deformation or collapse of the pattern occurs as shown in FIG. 5(*d*). When deformation or collapse of the pattern occurs, it obstructs further reduction and it becomes impossible to obtain desired dimensions.

Therefore, for the purpose of reducing dimensions without causing deformation or collapse of the photoresist film 28 and the antireflective film 27 to happen, in the present embodiment, the antireflective film 27 and the Cr film 26 are continuously etched using a mixed gas of chlorine ($Cl_2$) gas and oxygen ($O_2$) gas under the same etching condition for the antireflective film 27 and the Cr film 26 while etching in the side wall direction is advanced so that the pattern is made thinner.

Incidentally, etching processing time of the Cr film 26 is controlled by the light emission monitoring device 13 and so forth; the time when the Cr film 26 begins to be depleted, that it, the time when the Ta film 25 disposed as an underlying layer begins to be exposed is detected and set to be an etching end of the Cr film 26. At this time, light emission intensity of the reaction product, for example, light emission of a wavelength of 359 nm is captured and a time when a change begins or a time when a change ends is detected to define the end of etching of the Cr film 26.

When the etching rate of the Cr film 26 is examined in advance and the etching time is determined, the light emission monitoring device 13 is not necessary. If the timing of the etching end of the Cr 26 becomes late, however, etching is accelerated in the lateral direction abruptly and deformation or collapse of the photoresist pattern occurs. This is because at time when the Cr film 26 is depleted, oxygen radicals in the plasma concentrate on the photoresist film 28 and the antireflective film 27 to cause an excessive reaction.

In general, if the process gas is made low in the flow rate, especially the $O_2$ gas content is lowered, etching in the lateral direction can be delayed even if the timing of the etching end becomes late. When the $O_2$ gas content is lowered, chlorine radicals in the plasma react with the Ta film 25 disposed under the Cr film 26 and reaction products of $Ta_xCl_y$ base are generated.

In order to reduce dimensions of the Cr film 26 without causing deformation or collapse of the photoresist pattern to happen, therefore, by depositing a protective film on side walls of the photoresist film 28 to some degree while preventing the dimensions of the photoresist film 28 from becoming too thick, so that optimum balance is kept to advance etching in the side wall direction of the photoresist film 28, it is necessary to repeat formation of a protective film on side walls of the photoresist film 28 and etching of the photoresist film 28 in the side wall direction.

Figure 6:
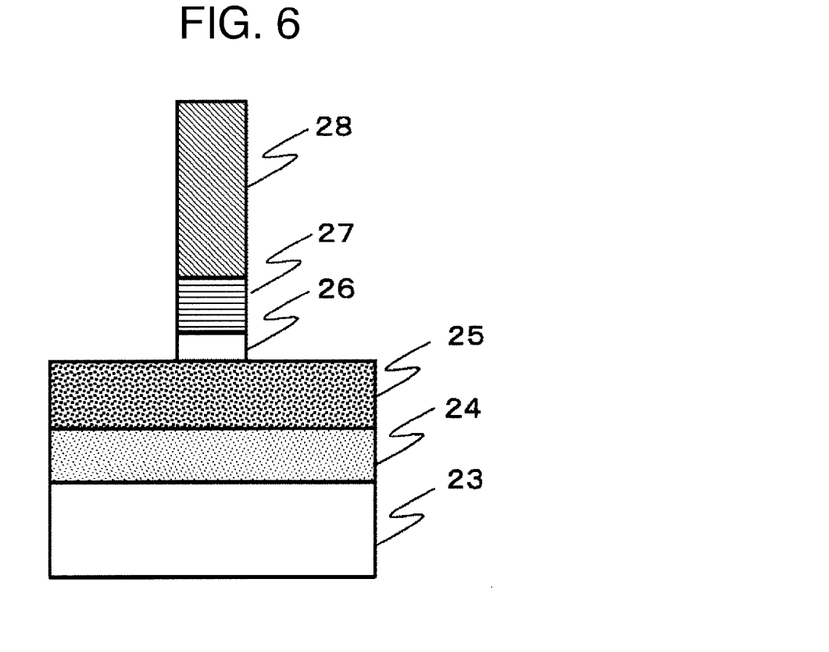
FIG. 6 is a diagram showing a trimming result of a Cr film.

In order to repeat formation of a protective film on side walls of the photoresist film 28 and etching of the photoresist film 28 in the side wall direction while keeping optimum balance, in the present embodiment, the antireflective film 27 and the Cr film 26 are etched using a mixed gas of chlorine ($Cl_2$) gas of 60 ml/min and oxygen ($O_2$) gas of 5 ml/min under the same etching condition of 0.3 Pa of the process pressure and 15 W of the radio frequency bias as shown in TABLE 1. As a result, a first mask with which the dimension of the Cr film 26 can be reduced from 60 nm, which is an initial dimension of the photoresist film 28, to 30 nm without causing deformation or collapse of the pattern to happen as shown in FIG. 6 can be formed.

TABLE 1

| GAS FLOW RATE (ml/min) | | PROCESS PRESSURE | RADIO-FREQUENCY BIAS POWER |
|---|---|---|---|
| $Cl_2$ | $O_2$ | (Pa) | (W) |
| 60 | 5 | 0.3 | 15 |

Although the Cr film is used in the present embodiment, the present invention is not restricted to the Cr film; as long as the material exhibits high selectivity to the Ta film 25 disposed in the underlying layer, it can be used. For example, a single layer film of Fe, Ni, Y, Zr, Ru, Hf, Au, Ag, Cu, or Al, a laminated film containing them, or their oxides can be used. However, optimization of the etching condition is needed accordingly.

Next, a mask removal process is conducted to remove all of the photoresist film 28 and the antireflective film 27. Because the Ta film 25, which is an underlying layer of the Cr film 26, is low in volatility, a reaction product 29 generated during etching of the Ta film 25 is apt to be deposited on the pattern side walls and, once it sticks, it is difficult to remove. When the reaction product sticks to the side walls of the mask pattern, it obstructs reduction of dimensions and it becomes impossible to obtain desired processing dimensions. Also, when the reaction product sticks to the side walls of the mask pattern asymmetrically in the lateral direction, bending or falling occurs toward the side to which it sticks more. In a case where the wiring is thick, damage of stress or a chemical action the mask pattern experiences does not become remarkable; when the dimension of the Cr film after the etching becomes as thin as 30 nm or less, however, pattern deformation or collapse occurs.

For obtaining desired dimensions, therefore, it is desirable to make the mask thin and prevent the reaction product from sticking excessively to the pattern side walls during etching of the Ta film 25.

With regard to etching of the Ta film 25, the selectivity of the Ta film 25 to the Cr film 26 becomes at least 10 by using a fluorine containing gas such as a mixed gas of chlorine ($Cl_2$) gas and methane tetrafluoride ($CF_4$) gas and a mixed gas of methane tetrafluoride ($CF_4$) gas and argon (Ar) gas. Consequently, when the film thickness of the Cr film 26, which becomes the mask, is 5 nm whereas the film thickness of the Ta film 25 is 50 nm, etching of the Ta film 25 becomes possible.

Figure 7:
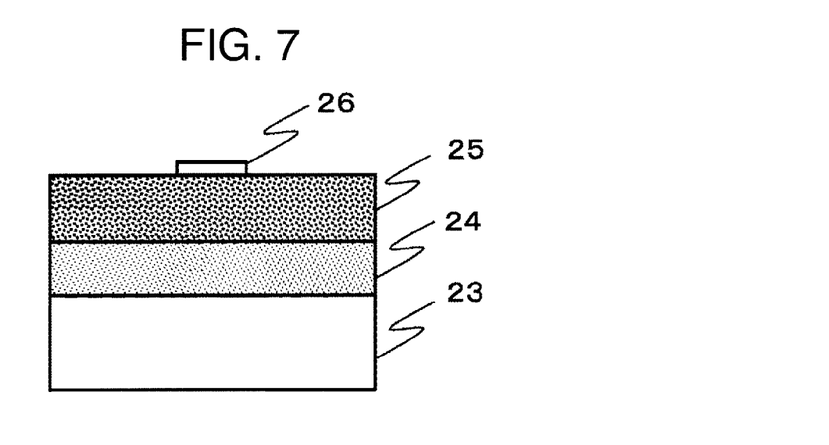
FIG. 7 is a diagram showing removal of a photoresist film and an antireflective film after plasma etching of the Cr film.

At the time of etching of the Ta film 25, therefore, it becomes possible to make the film thickness of the Cr film 26, which is the mask, as thin as 1/10 or less with respect to the film thickness of the Ta film 25. In the present invention, therefore, removal of the photoresist film 28 and the antireflective film 27 which have become unnecessary after the etching of the Cr film 26 is conducted and a mask that is as thin as 1/10 or less compared with the film thickness of the Ta film 25 is formed as shown in FIG. 7.

Owing to use of this thin mask, reduction of the Ta film 25 becomes possible and desired dimensions are obtained without deformation or collapse of the pattern occurring. The reason why reduction of the Ta film 25 becomes possible without deformation or collapse of the pattern occurring by using a thin film mask of the Cr film 26 will now be described with reference to FIG. 8.

Figure 8:
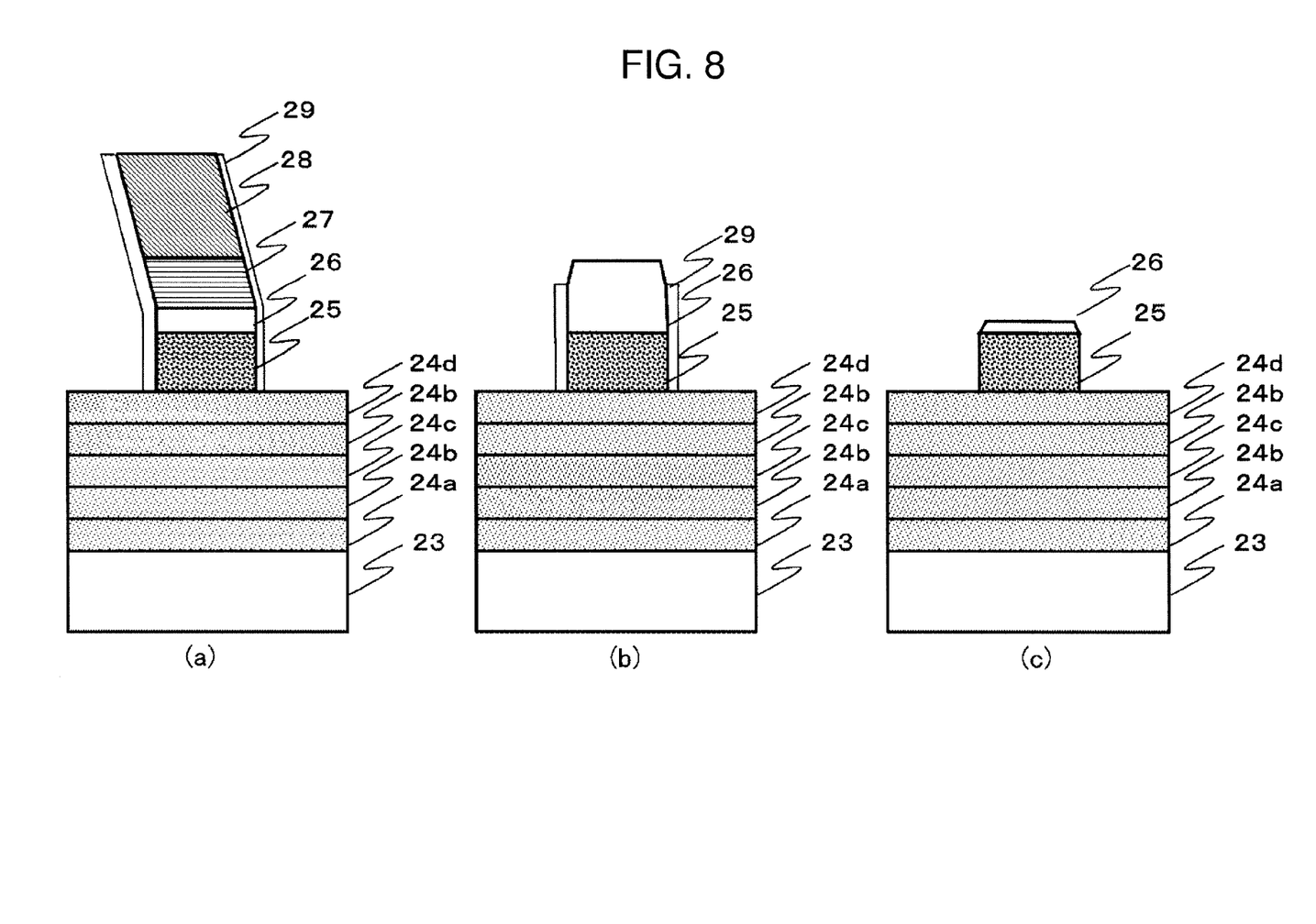
FIG. 8 shows an etching profile of a Ta film for each film thickness of a mask.

The etching profile of the Ta film 25 with respect to each film thickness of the mask is shown in FIG. 8. First, FIG. 8(a) shows an etching profile in a case where the photoresist film 28 and the antireflective film 27 are left intact and the Ta film 25 is etched. The reaction product 29 deposits on side walls of the pattern, and the pattern deforms and collapses due to the weight of the reaction product 29. Next, FIG. 8(b) shows an etching profile in a case where the Ta film 25 is etched with the Cr film 26 having the same film thickness as that of the Ta film 25. In the same way as FIG. 8(a), the reaction product 29 deposits on the pattern side walls. Although the mask as a whole is not tall and deformation or collapse of the pattern does not occur, however, the dimension becomes wide and a desired dimension cannot be obtained.

FIG. 8(c) shows an etching profile, next, when the photoresist film 28 and the antireflective film 27 are removed, the film thickness of the Cr film 26 is set to 1/10 with respect to the film thickness of the Ta film 25, and the Ta film 25 is etched. Since the film thickness of the Cr film 26 is thin, shoulder portions of the Cr film 26 are shaved in a somewhat tapered form, the reaction product 29 becomes hard to deposit on pattern side walls, and reduction of the dimensions progresses at the same time. As shown in FIG. 8(c), therefore, reduction of the Ta film 25 becomes possible without causing deformation or collapse of the pattern to happen by removing the photoresist film 28 and the antireflective film 27 and causing the film thickness of the Cr film 26 to become 1/10 or less with respect to that of the Ta film 25. As for the removal of the photoresist film 28 and the antireflective film 27, there is a method described hereafter.

A sample subjected to plasma etching in a first mask forming process is vacuum-transferred to the ashing processing chamber 18 so that the photoresist film 28, the antireflective film 27, and the Cr film 26, which are subjected to the plasma etching, and the reaction product that has stuck to the side walls are removed by plasma ashing.

For example, under the ashing condition where oxygen ($O_2$) gas of 1,000 mL/min is used as process gas, the pressure is controlled at 130 Pa, the radio frequency power is set to 1,000 W, and the wafer stage temperature is set to 250° C., processing of the sample 12 placed on the electrode 6 is conducted for 60 seconds as shown in TABLE 2, so that the photoresist film 28, the antireflective film 27, and deposits due to the reaction product 29 are removed.

TABLE 2

| $O_2$ GAS FLOW RATE (ml/min) | PROCESS PRESSURE (Pa) | HIGH FREQUENCY POWER (W) | WAFER STAGE TEMPERATURE (° C.) | ASHING TIME (seconds) |
| --- | --- | --- | --- | --- |
| 1000 | 130 | 1000 | 250 | 60 |

Incidentally, ashing processing of the photoresist film 28 is conducted while the ashing rate of the photoresist film 28 is examined in advance and the ashing time is determined. In addition, although a photoresist removing method in the ashing processing chamber 18 is used in the present embodiment, either that or in-situ ashing processing in which removal is conducted in an etching processing chamber 3 may be executed.

Then, a second mask forming process is executed. For example, as shown in TABLE 3, under the etching condition where a gas obtained by mixing chlorine ($Cl_2$) gas of 18 ml/min, methane tetrafluoride ($CF_4$) gas of 7 ml/min, and helium (He) gas of 50 ml/min is used, the process pressure is set to 0.3 Pa, and the radio frequency bias power is set to 17 W, etching is conducted with the Cr film 26 as the mask while reducing the Ta film 25 from the dimensions of the Cr film 26, which is the mask formed in the first mask forming process.

TABLE 3

| GAS FLOW RATE (ml/min) | | | PROCESS PRESSURE | RADIO FREQUENCY BIAS POWER |
| --- | --- | --- | --- | --- |
| $Cl_2$ | $CF_4$ | He | (Pa) | (W) |
| 18 | 7 | 50 | 0.3 | 17 |

As for the flow rate ratio between the chlorine ($Cl_2$) gas and the methane tetrafluoride ($CF_4$) gas, if the chlorine ($Cl_2$) gas is large in amount, etching is accelerated in the pattern side wall direction of the Ta film 25 and the profile becomes inversely tapered, resulting in causing deformation or collapse of the pattern to happen. On the other hand, if the methane tetrafluoride ($CF_4$) gas is larger in amount, C radicals supplied excessively deposit on the pattern side walls of the Ta film 25 to form a tapered profile and it becomes impossible to obtain desired dimensions.

For obtaining a vertical profile, therefore, optimization of the gas flow rate ratio between the chlorine ($Cl_2$) gas and the methane tetrafluoride ($CF_4$) gas becomes necessary. In the present embodiment, the gas flow rate ratio between the chlorine ($Cl_2$) gas and the methane tetrafluoride ($CF_4$) gas is set to 18 to 7 (18:7) to enable reduction of the Ta film 25 and implementation of a vertical profile compatible with each other.

Incidentally, the time when the Ta film 25 begins to be depleted, that is, the time when the MTJ film 24 disposed underneath begins to be exposed is detected by the light emission monitoring device 13 or the like and the etching processing of the Ta film is finished based on the detected end of the etching of the Ta film 25. For example, light emission at a wavelength of 515 nm is received, and the time when change of a light emission at the wavelength of 515 nm begins or the time when change of a light emission finishes at the wavelength of 515 nm is detected is regarded as the end of the etching of the Ta film 25.

When the etching rate of the Ta film 25 is examined in advance and the etching time of the Ta film 25 is determined, the light emission monitoring device 13 is not necessary. If the timing of the etching end of the Ta film 25 becomes late, however, chlorine radicals in the plasma react with the MTJ film 24 disposed under the Ta film 25, and a reaction product is generated.

Also, the reaction product of Ta generated during the etching of the Ta film 25 is poor in volatility and, once it sticks to pattern side walls, a protective film is formed and removal becomes difficult, so that reduction is obstructed and desired dimensions are not obtained. In the same way as the etching of the Cr film, therefore, compatibility between reduction of the Ta film 25 and suppression of generation of the reaction product from the underlying MTJ film 24 must be implemented.

In the present invention, for this purpose, helium (He) gas is added to chlorine ($Cl_2$) gas and methane tetrafluoride ($CF_4$) gas as shown in TABLE 3. As for effects brought about by adding the helium (He) gas, deposition of the reaction product on the pattern side walls is suppressed, reduction of the Ta film 25 becomes possible, and it becomes possible to obtain desired dimensions. It is considered that residence time of gas in the etching processing chamber is shortened by adding helium (He) gas and consequently deposition of the reaction product on the pattern side walls is suppressed.

Figure 9:
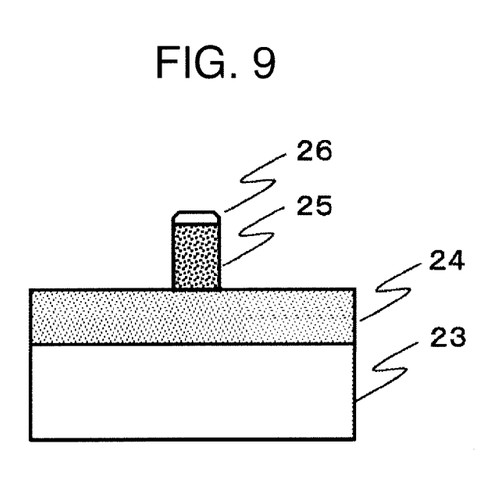
FIG. 9 is a diagram showing a trimming result of the Ta film.

Also, owing to addition of helium (He) gas, the ratio of the flow rate of chlorine ($Cl_2$) gas to the total gas flow rate of the mixed gas is decreased by dilution by the helium (He) gas, and generation of the reaction product when the MTJ film 24 underlying the Ta film 25 is exposed can be suppressed. As a result, deposition of the reaction product on the pattern side walls is suppressed, reduction of the Ta film 25 becomes possible, and it becomes possible to obtain desired dimensions, so that an etching profile as shown in FIG. 9 can be obtained.

In addition, the reaction product generated at the time of etching is apt to deposit on pattern side walls. Therefore, when the film thickness of the mask is thick, more reaction products deposit on the pattern side walls and, consequently, deformation or collapse of the pattern becomes apt to occur. In the present embodiment, by removing the photoresist film 28 and the antireflective film 27 and making the film thickness of the Cr film 26 to be 1/10 or less with respect to the Ta film, reduction of the Ta film 25 becomes possible without causing deformation or collapse of the pattern to happen. The dimension of the Ta film 25 at this time becomes 15 nm.

Incidentally, even though methane tetrafluoride ($CF_4$) gas is used to etch the Ta film 25, for example, gas containing fluorine such as methane trifluoride ($CHF_3$) gas, methane difluoride ($CH_2F_2$) gas, or sulfur hexafluoride ($SF_6$) gas may be used. However, optimization of the etching condition is needed according to the gas species.

In addition, because the present invention is not limited to the means using the Faraday shield as described above, the present invention may be applied to an inductively coupled plasma etching device, a microwave plasma etching device of an electron cyclotron resonance (ECR) scheme, a helicon-type plasma etching device, a capacitively coupled plasma etching device, or the like that does not have the Faraday shield.

With the plasma etching method according to the present invention, described heretofore, in a plasma etching method for reducing etching dimensions of a material to be etched from patterned dimensions, it is possible to reduce dimensions of the material to be etched without causing breaking or bending of a wiring of the material to be etched which may accompany reduction of dimensions of the material to be etched to happen.

REFERENCE SIGNS LIST

1 Inductively coupled antenna
2 Dielectric window
3 Etching processing chamber
4 Matching box
5 Gas supply device
6 Electrode
7 Plasma
8 Evacuation device
9 Faraday shield
10 First radio frequency power supply
11 Second radio frequency power supply
12 Sample
13 Light emission monitoring device
14 Atmospheric loader
15 Load lock chamber
16 Unload lock chamber
17 Vacuum transfer chamber
18 Ashing processing chamber
19 Vacuum transfer robot
20 First cassette
21 Second cassette
22 Third cassette
23 AlTiC substrate
24 MTJ film
25 Ta film
26 Cr film
27 Antireflective film
28 Photoresist film
29 Reaction product

The invention claimed is:

1. A plasma processing method for trimming a tantalum film by plasma etching using a resist, an antireflective film disposed under the resist, and a mask film disposed under the antireflective film, the plasma processing method comprising the steps of:
   trimming the antireflective film and the mask film by plasma etching with the resist as a mask;
   removing the resist after the antireflective film and the mask film are trimmed and the antireflective film subjected to the trimming, by plasma; and
   trimming the tantalum film by plasma etching with a mask film obtained after the antireflective film and the mask film are trimmed and the antireflective film subjected to the trimming is removed by plasma, as a mask.

2. The plasma processing method according to claim 1, wherein a thickness of the mask film is 1/10 or less of a thickness of the tantalum film.

3. The plasma processing method according to claim 2, wherein
   the mask film is a chromium film, and
   trimming of the antireflective film and the mask film is conducted by plasma etching using a mixed gas of chlorine gas and oxygen gas.

4. The plasma processing method according to claim 3, wherein
trimming of the tantalum film is conducted by plasma etching using a mixed gas of chlorine gas, methane tetrafluoride gas, and helium gas.

5. A plasma processing method for trimming a tantalum film by plasma etching using a resist, an antireflective film disposed under the resist, and a chromium film disposed under the antireflective film, the plasma processing method comprising the steps of:
trimming the antireflective film and the chromium film by plasma etching with the resist as a mask using a mixed gas of chlorine gas and oxygen gas;
removing the resist after the antireflective film and the chromium film are trimmed and the antireflective film subjected to the trimming, by plasma; and
trimming the tantalum film by plasma etching with a chromium film obtained after the antireflective film and the chromium film are trimmed and the antireflective film subjected to the trimming are removed by plasma, as a mask using a mixed gas of chlorine gas, methane tetrafluoride gas, and helium gas.

* * * * *